(12) United States Patent
Krokoszinski et al.

(10) Patent No.: US 9,307,650 B2
(45) Date of Patent: Apr. 5, 2016

(54) METHOD FOR MANUFACTURING A FOIL-LIKE ELECTRICAL CONNECTOR FOR CONNECTING SOLAR CELLS

(75) Inventors: Hans-Joachim Krokoszinski, Nussloch (DE); Martin Zippel, Berlin (DE)

(73) Assignee: SolarWorld Industries Thueringen GmbH, Arnstadt (DE)

(*) Notice: Subject to any disclaimer, the term of this patent is extended or adjusted under 35 U.S.C. 154(b) by 1133 days.

(21) Appl. No.: 13/381,263

(22) PCT Filed: May 19, 2010

(86) PCT No.: PCT/EP2010/056899
§ 371 (c)(1),
(2), (4) Date: Apr. 17, 2012

(87) PCT Pub. No.: WO2011/000629
PCT Pub. Date: Jan. 6, 2011

(65) Prior Publication Data
US 2012/0208411 A1  Aug. 16, 2012

(30) Foreign Application Priority Data

Jun. 29, 2009 (DE) .......................... 10 2009 030 997
Jan. 7, 2010 (DE) .......................... 10 2010 004 112

(51) Int. Cl.
*H05K 3/36* (2006.01)
*H05K 3/04* (2006.01)
(Continued)

(52) U.S. Cl.
CPC .............. *H05K 3/041* (2013.01); *B32B 37/02* (2013.01); *H01L 31/0516* (2013.01);
(Continued)

(58) Field of Classification Search
CPC .............. B32B 37/02; B32B 2038/047; B32B 38/1841; B32B 2457/12; H05K 3/041; H05K 3/202; H05K 3/281; H05K 3/341; H05K 2201/0394; H05K 2201/0397; H05K 2203/1545; H01L 31/0516; Y10T 29/49117; Y10T 29/4921; Y02E 10/50

USPC ................... 29/830, 831, 846; 174/256, 261; 257/774; 136/224, 251, 258
See application file for complete search history.

(56) References Cited

U.S. PATENT DOCUMENTS 3,903,427 A 9/1975 Pack
3,903,428 A 9/1975 DeJong
(Continued)

FOREIGN PATENT DOCUMENTS

CH              608 314      12/1978
DE       11 2005 001 252     5/2007
(Continued)

OTHER PUBLICATIONS

International Search Report for PCT/EP2010/056899, dated Dec. 27, 2010.
(Continued)

*Primary Examiner* — Donghai D Nguyen
(74) *Attorney, Agent, or Firm* — Maginot, Moore & Beck LLP (57) ABSTRACT

In a method for manufacturing a foil-like electrical connector for connecting solar cells to form modules, an insulating carrier film sheet is initially provided in a width which essentially corresponds to the width of the solar cells to be connected. Furthermore, a conductive foil sheet having a width that is matched to the carrier film is provided. In addition, comb structures as subsequent electrical connection fingers are formed. The conductive foil sheet is positioned on the carrier film with the aid of pin-shaped extensions of a transport belt or a transport roller. The carrier film is subsequently joined to the conductive foil sheet, preferably via an adhesive bond. In the next step, an insulating cover film is applied, in particular laminated.

15 Claims, 10 Drawing Sheets

Process sequence for the roll-to-roll manufacturing process for the film/foil tab according to the present invention (51) Int. Cl.
*B32B 37/02* (2006.01)
*H01L 31/05* (2014.01)
*B32B 38/18* (2006.01)
*B32B 38/04* (2006.01)
*H05K 3/20* (2006.01)
*H05K 3/28* (2006.01)
*H05K 3/34* (2006.01)

(52) U.S. Cl.
CPC ...... *B32B 38/1841* (2013.01); *B32B 2038/047* (2013.01); *B32B 2457/12* (2013.01); *H05K 3/202* (2013.01); *H05K 3/281* (2013.01); *H05K 3/341* (2013.01); *H05K 2201/0394* (2013.01); *H05K 2201/0397* (2013.01); *H05K 2203/1545* (2013.01); *Y02E 10/50* (2013.01); *Y10T 29/4921* (2015.01); *Y10T 29/49117* (2015.01)

(56) References Cited

U.S. PATENT DOCUMENTS

| 3,912,852 | A | * | 10/1975 | Simon | H01L 21/707 174/256 |
|---|---|---|---|---|---|
| 4,609,770 | A | * | 9/1986 | Nishiura | H01L 31/02008 136/244 |
| 5,972,732 | A | | 10/1999 | Gee et al. | |
| 2005/0268959 | A1 | | 12/2005 | Aschenbrenner et al. | |
| 2007/0283997 | A1 | | 12/2007 | Hachtmann et al. | |

FOREIGN PATENT DOCUMENTS

| DE | 10 2007 047 708 | 4/2009 |
| EP | 0 011 013 | 5/1980 |
| JP | 10-284745 | 10/1998 |
| JP | 2005-340362 | 12/2005 |
| WO | WO 2005/013322 | 2/2005 |
| WO | WO 2009/134939 | 11/2009 |

OTHER PUBLICATIONS

Gee, J. M. et al.: "Simplified module assembly using back-contact crystalline-silicon solar cells," Conference Record of the 26th IEEE Photovoltaic Specialists Conference 19970929; 19970929—19971003 New York, NY: IEEE, US, Sep. 29, 1997, pp. 1085-1088, XP010268032.

Schneider, A. et al.: "Solar Cell Efficiency Improvement by New Metallization Techniques—the Day4 Electrode Concept," Photovoltaic Energy Conversion, Conference Record of the 2006 IEEE 4th World Conference on, IEEE, PI, May 7, 2006, pp. 1095-1098, XP031507323.

* cited by examiner

Figure 1    Step 1: punching the carrier film using a punching tool

Figure 2a   Step 2: Cu foil of the same width

Figure 2b Step 2: punching of the Cu foil

Figure 2c Step 2: punching of the Cu foil

Figure 3 Step 3: adhesively bonding the punched Cu foil to the carrier film
A) Cross section (drawing not to scale in the x and y directions)
Bringing the perforations of the plastic film 100 and copper foil 200 together via pins (401) of a transport belt (400) or transport wheel (not shown)
B) Top view Figure 4 Step 4: Separating the side strips of the Cu foil and carrier film, reducing the overall width from B1 to B2 < B1
A) Top view
B) Cross section Figure 5 Step 5: laminating the cover film of width B3 (B2 < B3 < B1)
A) Top view
B) Cross section

Figure 6 Step 6: folding the edges (301) and (302) of the cover film or cover film strips (300) onto the bottom side of the laminate, in sections Figure 7    Separating points for film/foil tabs in the "continuous laminate" after x structures (example)

Figure 8    Series connection of two film/foil tabs having x cells by rotating a tab by 180°

Figure 9    Connection of y strings, having x cells each, to the end bus bars via transverse connectors Figure 10  Process sequence for the roll-to-roll manufacturing process for the film/foil tab according to the present invention Figure 11  Connection of the film/foil tabs to the solar cells 400

Figure 12a) Design of the film/foil tab punched-out wedges 114 und 115 in film/foil layers 100, 200, and 300

Figure 12b) Detailed illustration of punched hole 114
400 = solar cells with bevel (chamfered corner) are partially visible in the punched hole 114

Figure 12: Design detail for monocrystalline, i.e., pseudosquare, cells a) Previous design b) Cross section through 2 solder windows = punched holes 105 in subfigure a)

d) Cross section through 2 solder windows having solder passage (subfigure c))

c) Additional design with solder passage openings 222

Figure 13a-d: Punched holes 222 in copper foil 200 in the area of the punched holes 105 in carrier film 100

Figure 13e: Possible forms of the punching tool for producing the punches in the copper foil (schematic, not to scale)

Figure 14: Revised (or additional) sequence for manufacturing the connector

METHOD FOR MANUFACTURING A FOIL-LIKE ELECTRICAL CONNECTOR FOR CONNECTING SOLAR CELLS

BACKGROUND OF THE INVENTION

1. Field of the Invention

The present invention relates to a method for manufacturing a foil-like electrical connector for solar cells in order to connect the solar cells to form modules, the connector having a conductive layer and at least one insulating surface layer, and the present invention further relates to a foil-like electrical connector manufactured according to such a method, and a method for electrically connecting at least two solar cells to form a solar module, with the aid of a connector.

2. Description of Related Art

Interdigitated back-contact (IBC) cells, whose backside metal-plated structure is composed of two intermeshing metal finger combs, are part of the related art. Two such adjacent cells of a string are connected by soldering multiple small connecting tabs or a fairly large rectangular or bone-shaped copper sheet onto the edge pads which are part of the two cells to be connected, in each case at different polarities. The related art in this regard is characterized by published international patent application document WO 2005/013322 or published U.S. patent application document US 2005/0268959 A1.

Furthermore, for MWT cells it has been proposed to use backside connectors which have the form of an interdigital structure, i.e., intermeshing combs having wide copper sheets. This structure is designed to be present on a so-called backsheet, and in particular, provided on a large-surface plastic film. In this regard, reference is made to U.S. Pat. No. 3,903,428 and U.S. Pat. No. 3,903,427.

The solar cells are then positioned in a matrix array on the produced large-surface backsheets according to the pick-and-place process, and are subsequently connected to the copper sheets, using conductive adhesives.

Published German patent document DE 11 2005 001 252 T2 discloses a connection of solar cells to form a solar cell module, the solar cells being designed as backside-contact cells. A solar cell module includes a plurality of solar cells which are connected to one another as a solar cell matrix. A special connection system electrically contacts the back sides of two adjacent solar cells. The previously known connection system may have a connection which connects a contact point on a back side of one solar cell to a contact point on a back side of another solar cell, in addition a so-called connection shield being present between the solar cells and the connection. The connection shield advantageously provides electrical insulation between the connection and the edges of the solar cells in areas other than the soldering contact points, thus preventing electrical paths in the cells which reduce the efficiency. Specifically, the connection shield prevents soldering agent from migrating to the front sides of the solar cells during the soldering. In addition, the connection shield acts as a cell-to-cell spacer for assembly symmetry. In one embodiment, the connection shield is a one-sided or two-sided band with or without an integral coating. Thus, in the exemplary embodiment according to published German patent document DE 11 2005 001 252 T2 it is described that the connection shield is a polyester band approximately 6.2 mm wide which includes an acrylic-based adhesive.

The known backsheet technical approaches have the disadvantage that the entire back side of the module is usually made of a single flat film material, the film material supporting a structured copper coating. Coating a monolithic piece of film, having the typical dimensions of a cell module of approximately 160 cm×100 cm, with copper and structuring this coating is very problematic. A solder stop layer must be applied to either the copper sheet or the cells to be able to avoid electrical short circuits, which likewise entails technical problems.

As described, the connections of the cells to the backsheet to form a module are established with the aid of conductive adhesives whose resistivity in principle does not reach the low values of solders.

BRIEF SUMMARY OF THE INVENTION

Based on the above, it is therefore an object of the present invention to provide a refined method for manufacturing a foil-like electrical connector for solar cells to ensure an effective module connection, it being the aim for the connector to be inexpensively manufacturable and simple to handle.

Another object of the present invention is to provide a method for electrically connecting at least two solar cells to form a solar module, with the aid of a special foil-like connector which is available from a roll and which has defined width dimensions which are matched to the particular solar cells.

Accordingly, the present invention relates to the subject of electrical contacting of flat solar cells for producing larger modules. The structure and the method for manufacturing a connecting element to establish a linear, flat connection of numerous solar cells which are contacted on the back side to form a so-called string are proposed, as well as a methodology for ensuring an electrical and mechanical series connection of backside-contact solar cells or IBC cells for integrating same into a module.

In the method for manufacturing a foil-like electrical connector for solar cells, in order to connect the solar cells to form modules, the method initially starts with a connector having a conductive layer and at least one insulating surface layer.

According to the present invention, an insulating carrier film sheet is initially provided in a width which essentially corresponds to the width of the solar cells to be connected. In any event, this width is much smaller than the overall surface of a conventional standard solar module.

Recesses are then introduced into the carrier film in the area of subsequent soldering points, i.e., in the area of electrical contacting points, and into the side strip edge areas. The recesses introduced into the side strip edge areas, which are obtained by punching, for example, form an adjustment and transport perforation.

In addition, a conductive foil sheet having a width that is matched to the carrier film is provided, an adjustment and transport perforation likewise being introduced into this conductive foil sheet at the edge. In addition, comb structures as subsequent electrical connection fingers are formed, and retaining webs are implemented in the direction of the adjustment and transport perforation to ensure secure positioning of the comb structures for the subsequent precise positioning during formation of the module.

The conductive foil sheet is positioned on the carrier film with the aid of pin-shaped extensions of a transport belt or a transport roller, the extensions engaging in the corresponding adjustment and transport perforations.

The carrier film is subsequently joined to the conductive foil sheet, preferably via an adhesive bond. The side edge strips are subsequently removed and the retaining webs are severed.

In the next step an insulating cover film, or one cover film strip provided at each edge, is applied, in particular laminated. The cover film or the cover film strip provided at each edge in each case has a wide overhang in relation to the carrier film/conductive foil sheet composite.

The laterally overhanging edges of the cover film or the overhangs of the cover film strips are then folded, namely up to the bottom side of the composite to insulate the edges. The folded-down sections are then fixed, once again preferably via an adhesive bond.

The composite thus created is wound up to form a roll, and is used for subsequent processing.

In one embodiment, the recesses and perforations may be produced by laser radiation or the like.

The comb structures have a surface shape which is adapted to the contact configuration and the expected current intensity conditions of the solar module. The surface shape may be uniformly rectangular, or may also be tapered.

Prior to applying the cover film or the cover film strips, an adhesive layer is applied to ensure the above-mentioned fixing of the folded-down sections.

Prior to winding the composite into a roll, the adhesives are cured, for example by thermal treatment, the exposed conductive surfaces optionally being wetted with a fluxing agent and/or solder.

After a certain predefined length of the composite which corresponds to a number of x solar cells, separating points are formed, wider conductive transverse sheets being provided in the separating point section.

In one preferred specific embodiment, the conductive foil sheet is made of a copper material.

Prior to being brought into contact with the conductive foil sheet, the carrier film is wetted with an adhesive. This wetting may be carried out by spraying, for example, the sheets which are then brought together being laminated and joined under slight pressure.

Prior to folding, the cover film edges or the cover film strips may be cut from the outside, toward the middle of the composite, and severed, thus allowing the folding to be carried out more easily in sections.

The fluxing agent and/or solder may be wetted with the aid of a flow soldering bath.

According to the present invention, a foil-like electrical connector is manufactured according to the method described above.

Likewise according to the present invention, a method is provided for electrically connecting at least two solar cells to form a solar module, with the aid of the connector according to the present invention, as explained above.

An operation from a roll is carried out in the method for the electrical connection, in each case x solar cells being connected to the unwound section to form a string by contacting the soldering points of the cells to the contact points which are exposed through the punched holes in the carrier film, with the aid of a soldering step. The string produced in this way is subsequently positioned on a transparent sheet material which is provided with an encapsulation material, and rotated by 180° relative to a preceding string, a series connection of the strings resulting via the provided transverse connectors.

The main features of the present invention may be summarized as follows:

Starting with a foil connector or foil tab, foil sheets are used which have a width that approximately corresponds to that of a solar cell, for example 6". The foil connector starts with a plastic film which is coated with a copper material, another plastic film being provided as a cover layer, and in particular forming a laminate. The foils are sequentially structured, adhesively bonded, and wound onto a roll.

Furthermore, according to the present invention the side edges of the foil sheets are provided with a perforation using a punching technique, for example, on the one hand to facilitate transport as the result of engagement with corresponding extensions or pins of a transport belt, and on the other hand to ensure a secure adjustment of the sheets one above the other, and thus with respect to one another.

Another feature according to the present invention is the special insulation of the edge of the foil connector with the aid of the second plastic film, which may be designed as a cover film, either over the entire surface or in narrow strips as strictly an edge cover.

FIGS. 13a through 13d show how solder passage openings in the conductive foil (copper foil) and in the cover film make it possible for fluxing agent which evaporates on the solder pads of the solar cells during fusion of solder reservoirs, as well as a certain quantity of solder, to be conducted to the outside, thus increasing the long-term stability of the electrical connection.

FIG. 14 shows a second technical implementation of the manufacturing method according to the present invention, in which foils having a dried-on adhesive film over the entire surface in the delivered state are used, it being possible to liquefy the adhesive film by applying pressure and heat in order to carry out a lamination and bonding process. When these types of foils are used, the otherwise necessary process step of wetting with adhesive may be dispensed with. FIG. 14 additionally shows the use of a punch 4 for providing recesses in the cover film in the area of subsequent soldering points, the dimensions of these recesses being larger than the dimensions of the recesses in the conductive foil sheet.

DETAILED DESCRIPTION OF THE INVENTION

Figure 1:
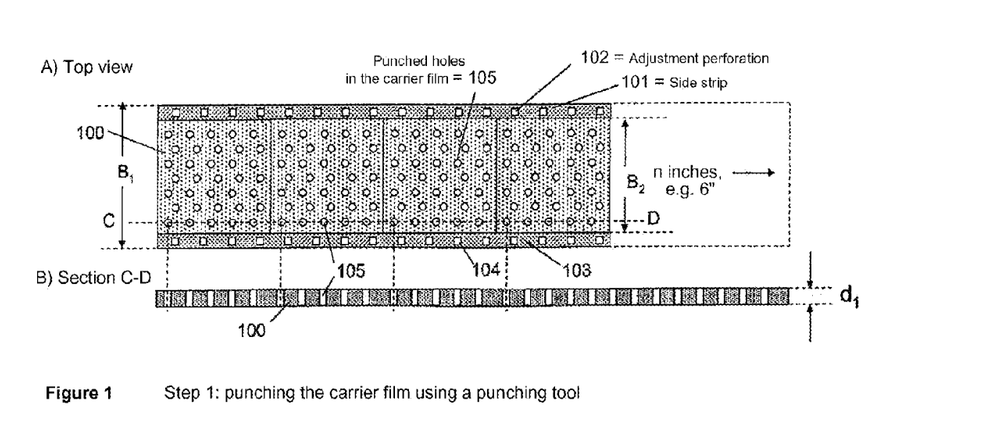
FIGS. 1 to 7 show a basic sequence of the method for manufacturing the foil-like electrical connector for solar cells.

FIG. 1a shows a top view, and FIG. 1b shows a sectional illustration of a carrier film 100 having thickness d1 and width B1. Width B1 is slightly greater than the edge length of the solar cells to be connected.

With reference to FIGS. 1a and 1b, the design of the carrier film after punching with a punching tool, not illustrated, is apparent, the punching tool simultaneously forming perforation holes 102 and 104 on side strips 101 and 103, respectively.

Holes 105 in the area of the subsequent soldering points may likewise be produced simultaneously on the solar cells.

Figure 2A:
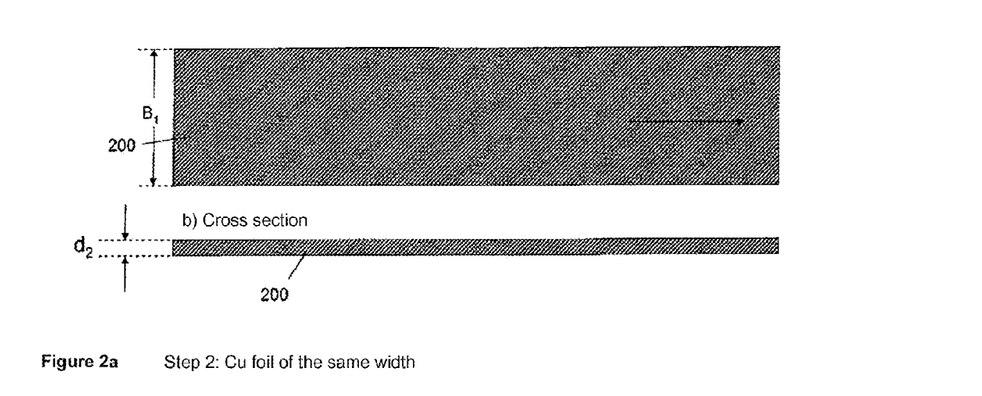
Figure 2B:
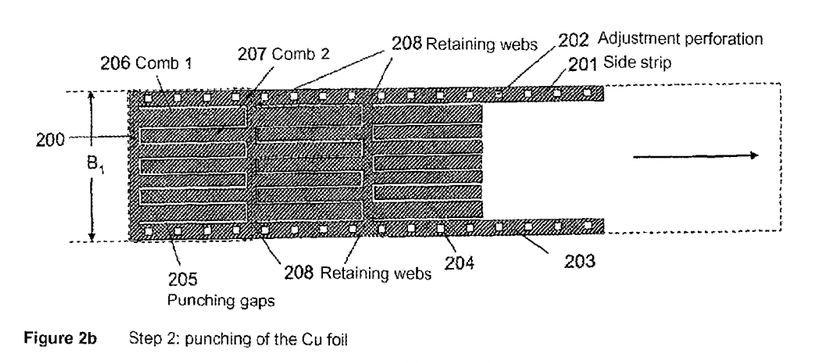
Figure 2C:
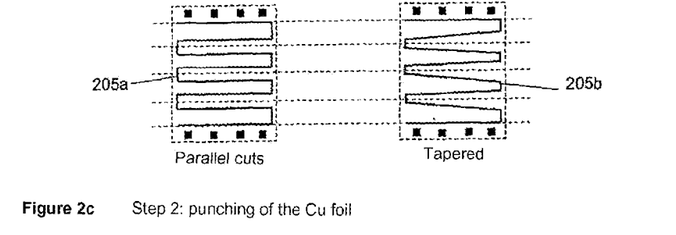

The second method step is illustrated in FIGS. 2a through 2c.

According to FIG. 2a, a copper foil as a conductive foil sheet having thickness d2 and the same width B1 as plastic film 100 is prepared for the structuring by rolling off from a large foil supply roll. Copper foil 200 is processed using a punching tool. Copper sheets 205a or 205b according to FIG. 2c are produced, and in addition separating lines are formed as punching gaps 205. Appropriate insulating areas may thus be implemented between the copper sheets, which are part of various comb structures 207 and 208. Likewise, perforation holes 202 are provided on side strip 201. As shown, the perforation holes 202 are present on the top side strip 201, and perforation holes 204 are present on bottom side strip 203.

According to the present invention, connecting or retaining webs 208 are left at the two side strips 201 and 203 with the aid of the punching tool in order to fix the individual copper sheets in their original position.

The copper sheets may be rectangular (205a) or also tapered (205b) in order to take into account the increasing current intensity at the end of the conductive track.

Figure 3:
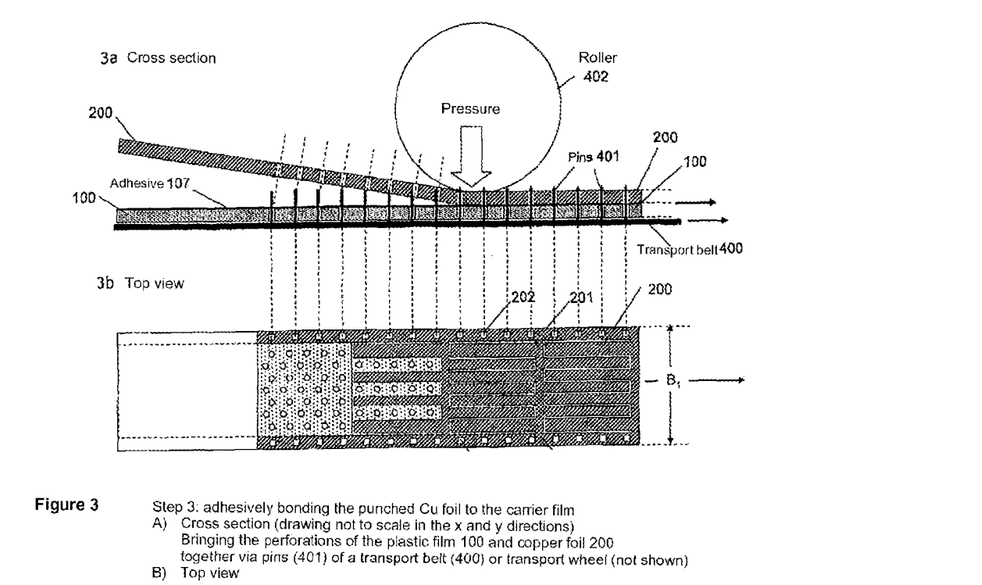

In the next method step according to the illustrations according to FIGS. 3a and 3b, copper foil 200 is adhesively bonded to plastic film 100 with the aid of an adhesive 107 which has previously been applied to the surface of plastic film 100.

Furthermore, it is illustrated that perforation holes 102 and 104 in the plastic film are exactly aligned with perforation holes 202 and 204 via pins or extensions 401 of a transport belt 400. As a result, the punched structures in the interior of the connector are also adjusted with respect to one another as precisely as allowed by the given tolerances in adapting to the diameters of the perforation holes and pins 401.

Symbolically illustrated transport belt 400 moves synchronously with film and foil 100 and 200, respectively, beneath a heated roller or cylinder 402 or an appropriately heated punch (not shown). The film and foil may be moved, and thus adjusted, by a linear motion of the pins, or, if a transport wheel is used, by corresponding circumferential pin motion.

Figure 4:
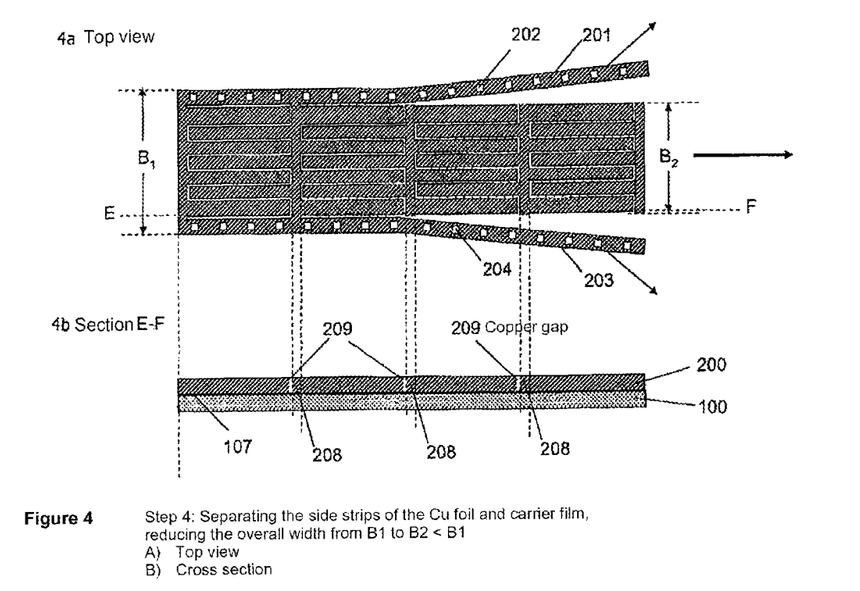

In the next step, explained with reference to FIGS. 4a and 4b, perforated side edges 101; 201 and 103; 203 which are adhesively bonded together are separated, for example cut off, thus reducing the width of the film/foil composite from B1 to B2.

Since the copper combs together with the adhesive, which has not yet cured, are fixed on the carrier film, retaining webs 208 may now be severed without changing the position of the copper combs relative to one another.

Thus, according to illustration E-F (FIG. 4b), copper gaps 209 are formed between adjacent copper combs at the cut edge.

Figure 5:
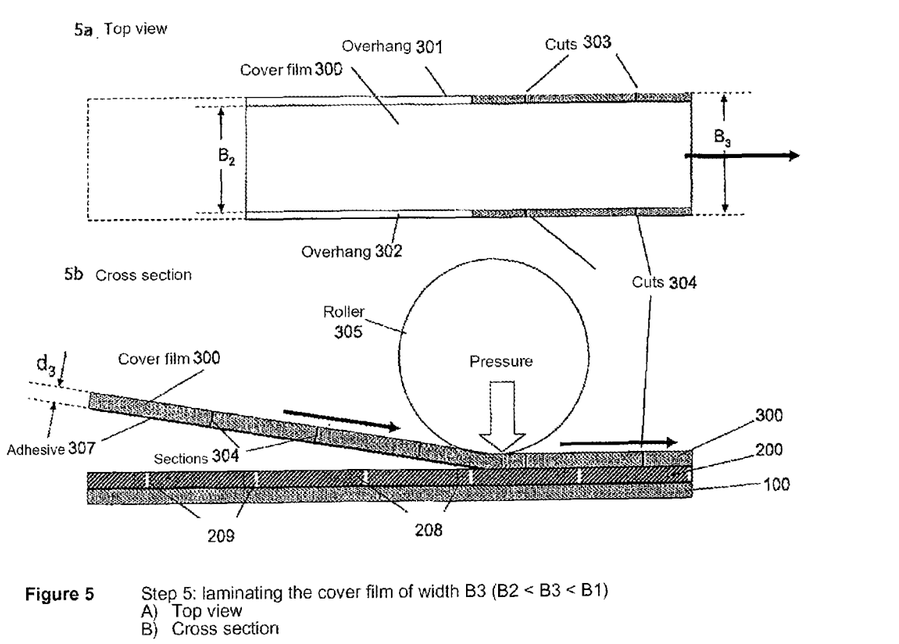

A cover film 300 having width B3≥B2 and thickness d3 is subsequently laminated onto copper-plastic composite 100; 200 (see FIG. 5).

Before cover film 300 is supplied to laminating roller 305, the bottom side of film 300 is wetted with an adhesive 307. In one embodiment, small indentations 303 and 304 having length (B2−B3)/2 of overhangs 301 and 302 may be provided at the two overhanging edges 301 and 302, approximately in the middle of the periodic structure of the foil connector according to the present invention.

Figures 6, 6C, 6C:
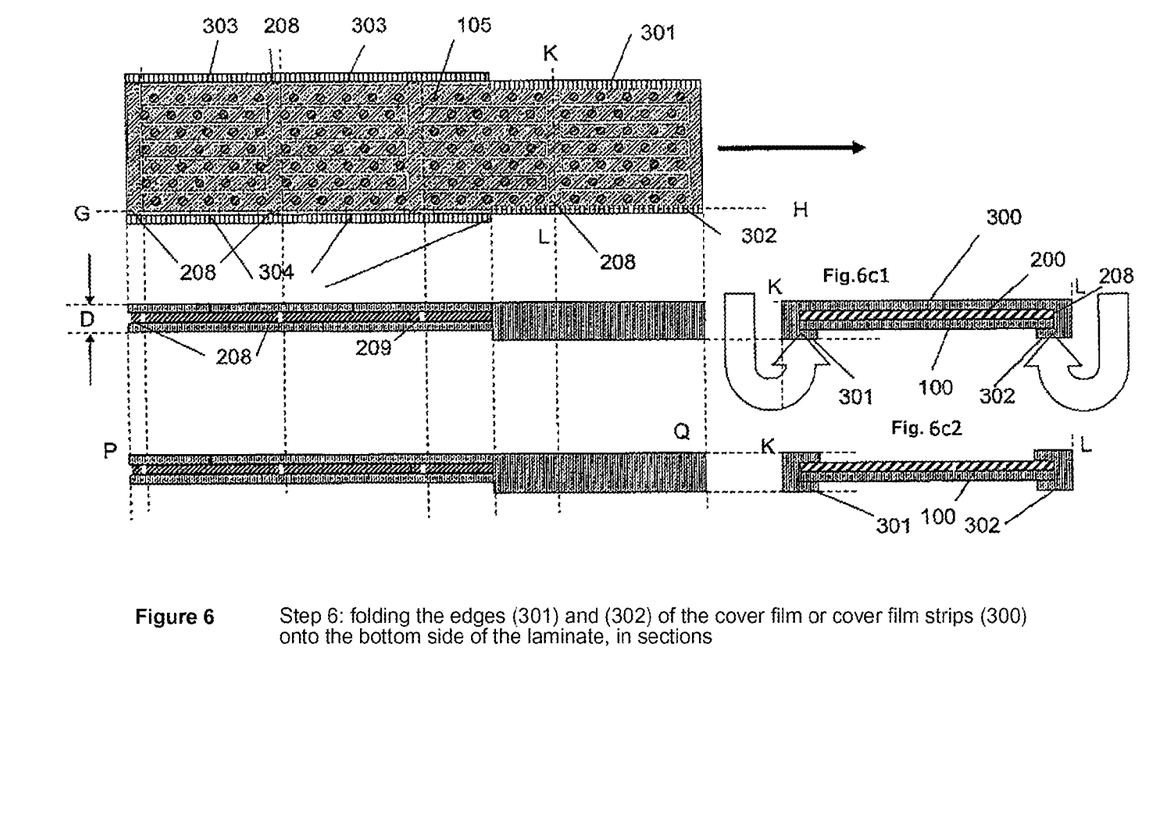

In the subsequent method step according to FIG. 6, the overhanging edge sections between indentations 303 and 304 are placed around the outer edge, and in particular are folded over, in a manner of speaking, by 180°. Folds 301 and 302 are then adhesively bonded to the bottom side of the film/foil composite having overall thickness D.

Punched holes 105 in carrier film 100 according to the first method step and indentations 303 and 304 from the fifth method step are visible in the view from below.

Indentations 304 and severed copper retaining webs 208 as well as copper gaps 209 formed adjacent thereto are apparent from sectional illustration G-H.

By folding the cover film onto the side of the carrier film, the end faces of these copper sheets extending up to the edge of the carrier film are sheathed with insulating material, thus insulating the copper sheets from external contact.

The covering of edges 208 by folding over and adhesive bonding of edges 301 and 302 of film or film strip 300 are apparent from sectional illustration K-L (FIGS. 6c1 and 6c2).

Figure 10:
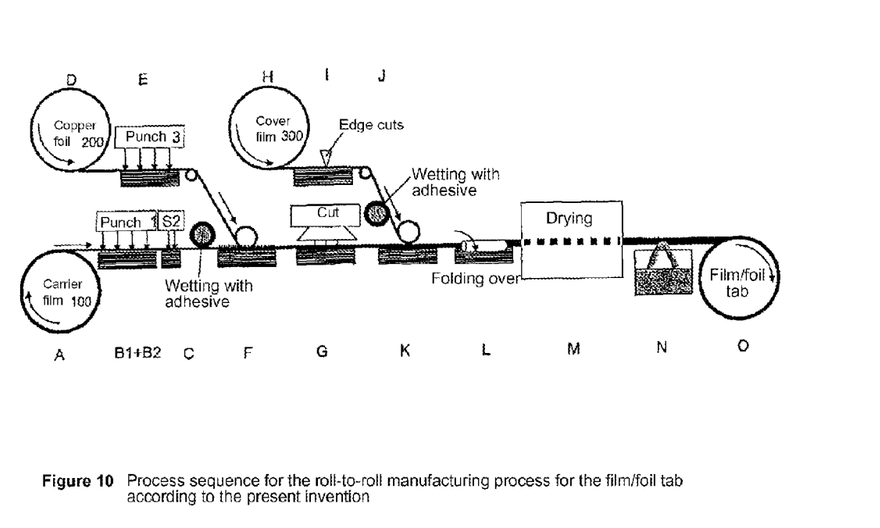
FIG. 10 shows an example of a process sequence for the roll-to-roll manufacturing method of the foil-like electrical connectors according to the present invention.

In a final step, adhesive layers 107 and 307 are cured by passing the laminate through a furnace or a so-called laminator (also see step M according to FIG. 10).

Optionally, presoldering may be carried out in punched holes 105, 108, and 109 at the exposed copper surfaces, for example by guiding the composite over a solder wave in a flow soldering device, followed by winding up and forming a roll (step O according to FIG. 10).

Although the previously described method in principle involves a continuous laminate having periodic processing, the special character of a module connector must be taken into account. In other words, after a given number x of solar cells which are to be connected to one another in series, the foil connector is provided with an interface at which the laminate may be separated and connected to transverse connectors for an adjacent row of cells.

Figure 7:
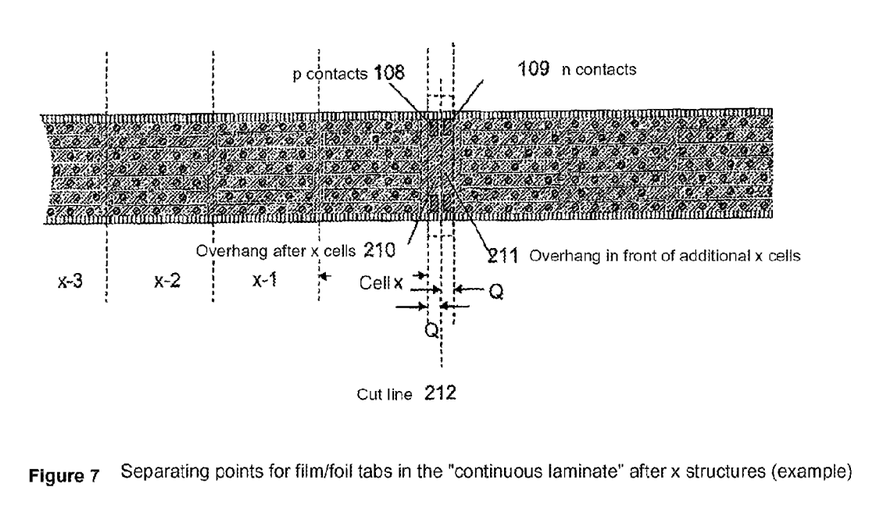
Figure 8:
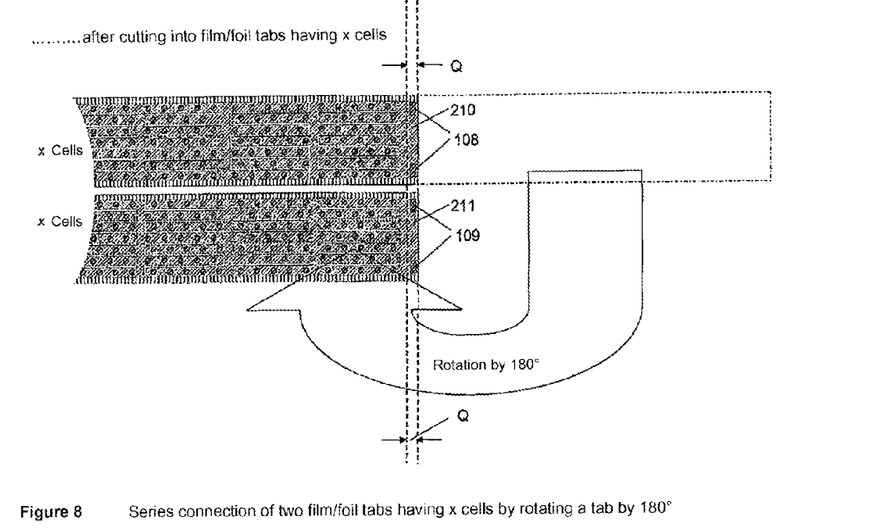
FIG. 8 shows a series connection of two foil connectors to x solar cells.

FIG. 7 shows an example thereof, in which it is apparent how, after x solar cells, a widening of transverse copper sheet 210 by Q, having punched surfaces 108 beyond the cell structure area which represent, for example, the contacts to comb 207 of polarity p, is inserted into carrier film 100. Before the next cell structure area, an overhang of copper sheet 211 having the same width and having punched holes 109 in the carrier film is added at this section. In addition, the connection to copper comb 206 is provided at polarity n, at which the next chain of x solar cell structures begins. In this way, the continuous strip may be separated at interface 212 and soldered to x solar cells for the module integration of the foil connector. The next row of x solar cells is then placed next to the previously produced row by rotating by 180° (see FIG. 8), so that p contacts 109 and n contacts 108 come to rest one beneath the other.

Figure 9:
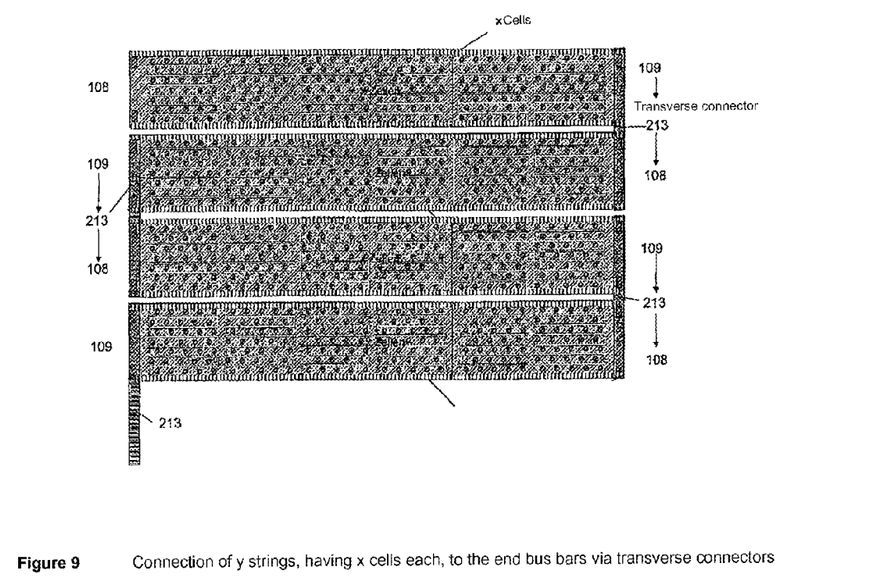
FIG. 9 shows connection of y strings to x solar cells each via transverse connectors on end bus bars.

For the module connection of the y rows to every x cells, it is then necessary only to solder transverse copper connectors 213 to these end contacts 108 and 109 (see FIG. 9). A module having x·y cells (typically 6·10 cells, for example) is thus produced from y strings.

Another embodiment of the present invention provides that cover film 300 does not completely cover the copper foil, but instead is formed only as two narrow strips which, overhanging at the two edges, are laminated onto the copper foil and folded over. The need for heat-resistant plastic film, and therefore the costs of the method and of the connector, is/are thus reduced.

Figure 11:
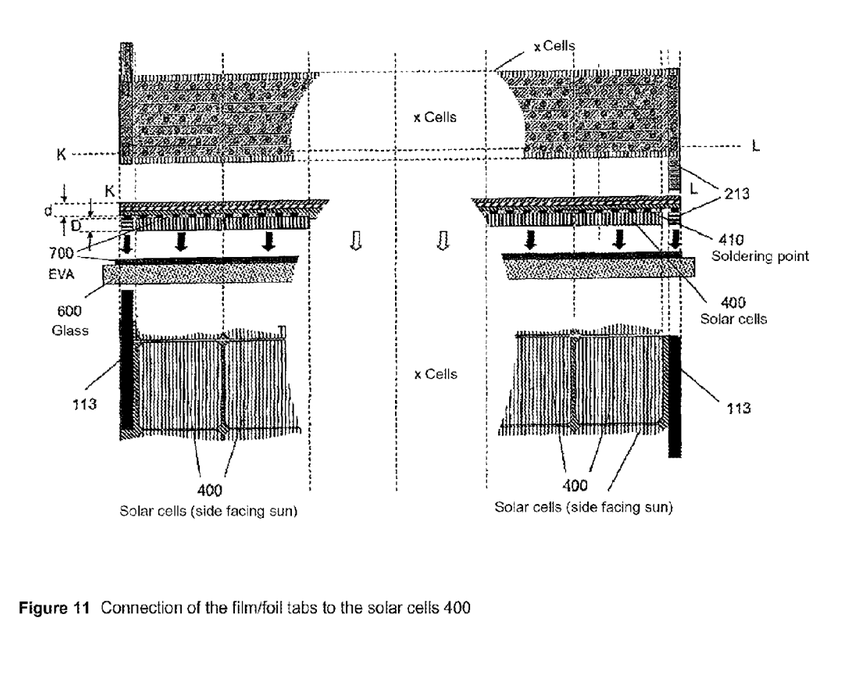
FIG. 11 shows the mounting of the foil-like electrical connector on solar cells.

The module integration is described with reference to FIG. 11.

The use of the foil connector according to the present invention is based on the "tabbing and stringing" method; i.e., in each case x solar cells 400 are connected to a foil connector to form a string, in that soldering points 410 on cells 400 are soldered to the copper contact points in the carrier film which are exposed through punched surface 105, 108, and 109.

The solder for the soldering points may be applied on the soldering points either beforehand by deposition via a solder wave, or shortly before the soldering by dispensing from a solder cartridge or by solder screen printing. The soldering is carried out using a known soldering technique, for example infrared soldering, hot bar soldering, hot air soldering, an inductive soldering step, or so-called reflow soldering.

A string produced in this way is subsequently positioned on a glass sheet 600, which is rotated by 180° relative to the previous string and is coated with a transparent layer of encapsulation material 700. According to FIG. 9, the strings are connected in a row via transverse connectors 213 having the same thickness D as the solar cells, before the back side film is applied and the entire composite is laminated in the laminator.

In one advantageous variant, a layer of encapsulation material, for example EVA, is also positioned between the foil connectors and the solar cells so that no interfering air layer remains between the foil connector and the solar cells after the overall module composite is soldered and laminated.

A first technical implementation of the explained manufacturing method for the foil connector is described with reference to FIG. 10.

A roll-to-roll process is assumed; the sequence of the steps is schematically illustrated in FIG. 10.

Carrier film 100 is unwound from a supply roll in a first station A, the carrier film having a width B1 and a thickness d1.

In step B, a first punch (S1) is provided for producing perforation holes 102 and 104 as well as contacts 105 for copper combs 206 and 207, and a second punch (S2) is provided for punched holes 108 and 109 in the overhangs for the transverse connections after every x cell structure areas.

In section C the top side of carrier film 100 is wetted with adhesive 107 if carrier film 100 does not already have a heat- and pressure-activatable adhesive layer.

Copper foil 200 is unwound from a corresponding supply roll in section D. The copper foil has width B1 and a thickness d2.

In section E, a punch 3 is provided for producing perforation holes 200, 202 and 204 in side edges 201 and 203, respectively, of copper foil 200 and for producing separating lines 205 between copper combs 206 and 207. Connecting webs 208 to side strips 201 and 203 are preserved.

In section F, carrier film 100 and copper foil 200 are brought together, using the perforation for the fine adjustment for the punched structures in both the film and the foil, and lamination is carried out via contact pressure with the aid of a symbolically shown roller.

The cutting of perforated strips 101, 102 and 201, 202, i.e., the reduction of the laminate width from B1 to B2, is carried out in section G.

Cover film or cover film edge strips 300, having overhangs 301 and 302 over the sides of the composite composed of film 100 and copper foil 200, is/are unwound from the supply roller at (H).

In area I, cuts in each case having a cutting depth (B3-B2)/2 are made in overhanging strips 301 and 302 on both sides of cover film or cover film edge strips 300, at periodic intervals along the length of a solar cell.

The bottom side of cover film 300 is wetted with adhesive 307 in section J. In section K, cover film or cover film edge strips 300 is/are brought together with copper-plastic laminate 100/200 by contact pressure with the aid of a roller.

Step J may be dispensed with if the bottom side of cover film 300 has already been provided with a pressure- and heat-activatable adhesive.

In area L, cut overhanging edges 301 and 302 are folded over to make it easier to process the side edges of copper-plastic laminate 100/200, namely by contact pressure with the aid of a roller or similar means guided along the edge.

In area M, adhesive layers 107 and 307 of the copper-plastic laminate are cured in a continuous furnace or a laminator.

Optionally, pretinning or presoldering of the contacts may be carried out in area N, for example using a solder wave in a flow soldering bath. The foil connector is then wound onto a supply roll in area O.

Figure 12:
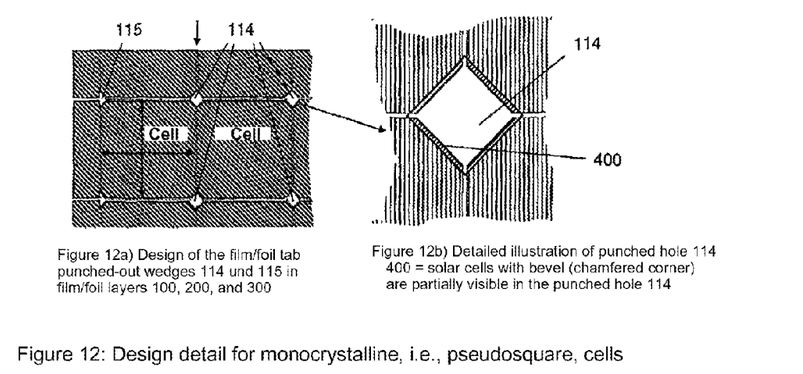
FIGS. 12a and 12b show one refinement according to the present invention of the embodiment of the foil connectors for their use in so-called pseudosquare solar cells, which have bevels (chamfers) in the corner areas.

In the previous discussion it has been assumed that full-square solar cells are to be contacted. In the case that monocrystalline pseudosquare cells having bevels in the edge area are used, it has to be assumed that the bottom side of the foil connector is visible through the sections which are left by the bevels. In this regard, problems may result in particular for carrier film 100 situated at the very front relative to the light incidence direction, if this carrier film is not stable under UV radiation load in order to avoid optical degradation. In other respects, if carrier film 100 is not completely opaque, the conductive foil, i.e., copper foil 200, would also be discernible through carrier film 100, resulting in an undesirable optical effect. As is apparent from FIGS. 12*a* and 12*b*, punched-out wedge areas 114 and 115 are provided in film/foil layers 100, 200, and 300 to avoid the above-described effect. The detailed illustration of a punched hole 114 according to FIG. 12*b* shows a beveled corner or chamfer area 400 of a solar cell, which is partially discernible in punched hole 114 but which does not cause optical interference. Area 114 is punched out from film and foil layers 100 and 200, respectively, in such a width that, when viewed from the opposite side, the foil connector surface is visible only in the strips between the cells, for backside contact cells it being possible to keep the corresponding gaps between the cells very narrow, so that there is no concern for optical impairment over a fairly long service life.

Figure 13A:
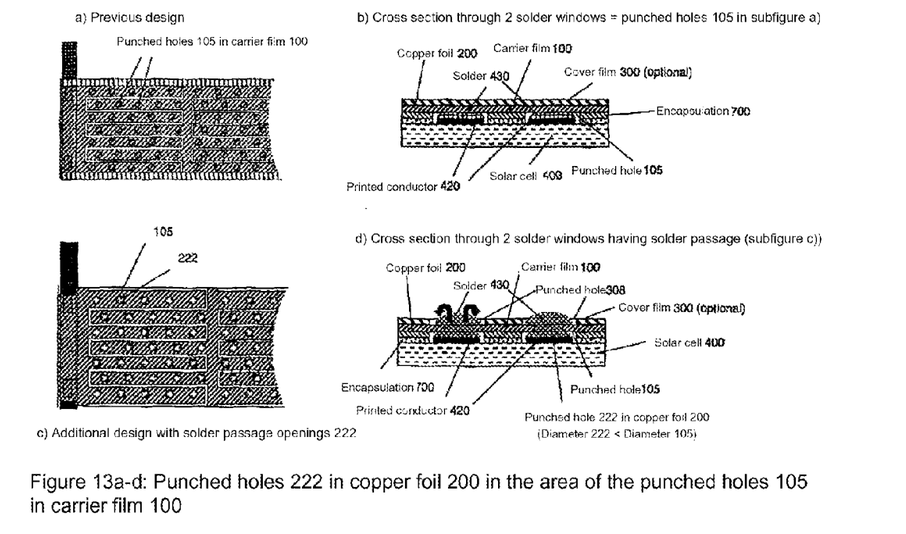
Figure 13E:
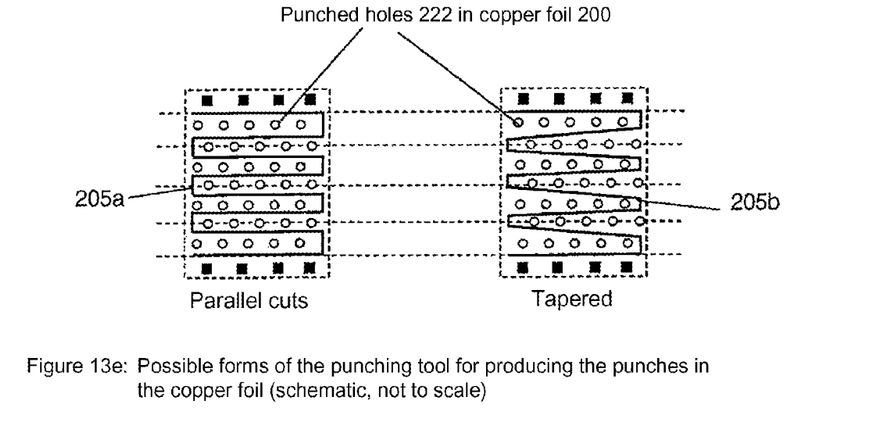
FIG. 13e shows a schematic illustration of basic embodiments of a punching tool for producing the additional punched holes in the conductive foil, in particular copper foil.
Figure 14:
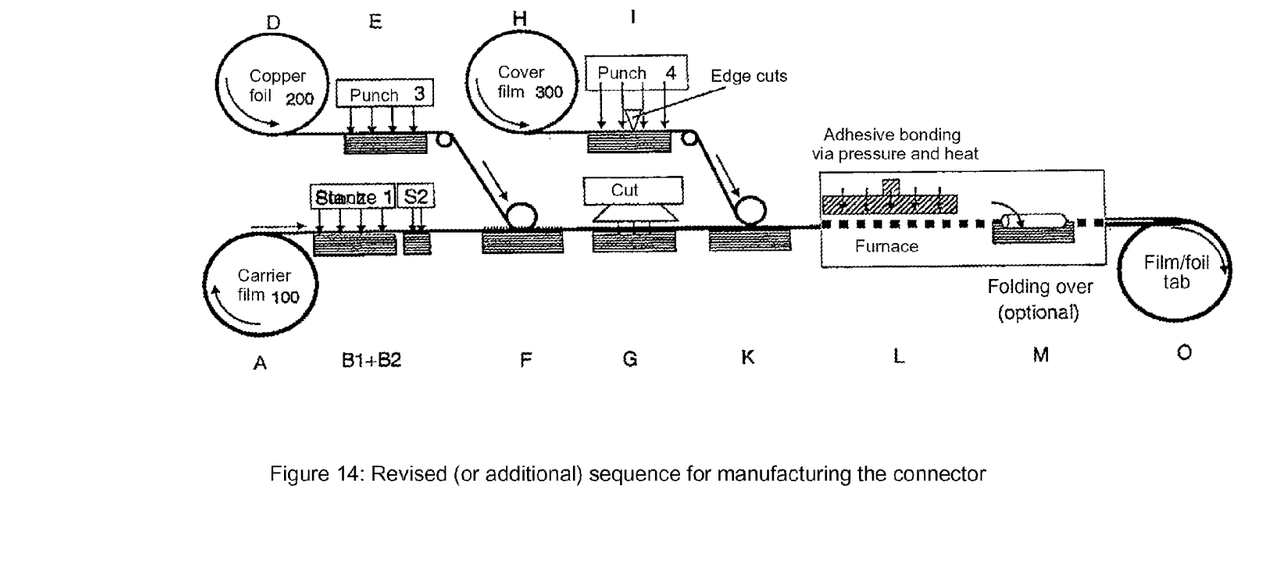

When the solar cells are connected to the foil connector by soldering, there is the risk that when solder reservoirs on the solder pads of the solar cells melt, the evaporating fluxing agent or other gases are unable to pass through the connector to the outside. As a result, the only option would be for these types of gaseous components to escape via the cell surface toward the edge of the cells and of the foil connector. However, this may result in residues on the cells and undesirable corrosion. To avoid such long-term problems in the completed solar cell module, it is proposed according to the present invention to open at the soldering points not only carrier film 100 by punching (see FIG. 13*a*), so that the solder is able to contact the conductive bottom side of the film from below, but in addition to open conductive foil 200 itself in the solder areas by punching a corresponding recess (FIG. 13*c*). The additional punched hole 222, as illustrated in cross section in FIG. 13*d*, is slightly smaller than opening 105 in the carrier film. In this way, during fusion the solder is able to spread not only on the bottom side of the copper area of the conductive foil (copper foil 200), but also partially on the top side of the copper foil.

When cover film 300 is optionally used, lateral delimitation of the solder flow on the top side of the copper foil is ensured by the edges of openings 308 in cover film 300. The spreading of solder 430 is indicated by arrows in FIG. 13*d*.

Thus, as explained above, via the system according to FIG. 13*d* an option is provided for opening up an unhindered path to the outside for gaseous, volatile solder paste fractions. Introduced recesses 222 in conductive foil 200 may also be used to individually align the solar cells beneath the foil connector, i.e., to monitor the positions and the rotation of the cells to be soldered, with the aid of optoelectronic means such as cameras over the installation surface, and to correct same if necessary, so that all soldering surfaces together with the solder reservoirs are simultaneously discernible, through the holes, by the camera used for monitoring. Only then is a soldering head moved down onto the corresponding array, and the soldering is carried out.

During soldering of the solder reservoirs to the conductive foil situated thereabove which is provided with recesses, i.e., perforated, a portion of the solder advantageously passes through the recess, resulting in a certain spreading on the conductive surface (copper surface), provided that this is permitted by the optional surface coating with cover film 300. The soldering point thus acquires a sort of mushroom shape, resulting in better contacting and also increasing the shear strength, i.e., the mechanical strength, of the contacts.

Compared to known connectors, the connector is not just a narrow copper strip for each individual connection, but, rather, represents a foil sheet almost completely covered with copper, and which has approximately the width of a solar cell and the length of a module, so that all contact points, and in particular as many as desired, may be contacted simultaneously to adjacent cells. A significant advantage in handling is thus achieved, since after the cells are positioned, only a portion, namely, the foil connector, has to be placed on the row of cells and soldered. For such a linear foil element, adjusting the appropriate contacts in the connector to those on the cells is much easier than for a very large-surface sheet having the dimensions of the overall module. The foil connector may be manufactured, as described, in a fully automated roll-to-roll process, and may thus be implemented in large quantities and at low cost. The concept according to the present invention of the three-layer foil connector which is adhesively bonded around the edges thus allows the fully automatic module integration of backside-contact solar cells having solder points of any desired number and configuration, in contrast to linear connections between every two or three bus bars on the front and back sides of standard cells.

When pseudosquare solar cells are used, as the result of punching out diamond-shaped areas or triangular areas in the carrier film, in the conductive foil, and in the optional cover film, the situation is avoided that the foil connector is visible in these areas from the outside through the solar cell glass. On the other hand, gaps on the longitudinal sides between the solar cells may be limited to a very small width on account of the one-sided connection technique selected, so that no interfering optical effect results here. It is thus ensured that the carrier film used is not subjected to load under UV radiation, and thus possibly optically or chemically degraded.

What is claimed is:

1. A method for manufacturing a foil-like electrical connector for connecting solar cells to form at least one solar module, the method comprising:
   providing an insulating carrier film sheet having a width which essentially corresponds to the width of the solar cells to be connected;
   subsequently introducing into the carrier film sheet (i) recesses in an area corresponding to future soldering points, and (ii) adjustment and transport perforations into side strip edge areas;
   providing a conductive foil sheet having a width corresponding to the carrier film sheet, wherein (i) adjustment and transport perforations are introduced into the conductive foil sheet at side strip edge areas, (ii) comb structures configured to function as electrical connection fingers are provided in the conductive foil sheet, and (iii) retaining webs are provided in a direction of the adjustment and transport perforation to ensure secure positioning of the comb structures;
   positioning the conductive foil sheet on the carrier film sheet with the aid of pin-shaped extensions of one of a transport belt or a transport roller, the extensions engaging in the corresponding adjustment and transport perforations of the conductive foil sheet and the insulating carrier film sheet;
   joining the carrier film sheet to the conductive foil sheet via an adhesive bond to form a composite sheet;
   separating the side edge strips and severing the retaining webs;
   laminating an insulating cover film at each side edge of the composite sheet, the cover film having lateral overhangs in relation to the side edges of the composite sheet; and
   folding the lateral overhangs of the cover film and fixing the folded lateral overhangs to the bottom side of the composite sheet to form the foil-like electrical connector, wherein the folded lateral overhangs insulate the edges of the composite sheet.

2. The method as recited in claim 1, wherein the recesses and perforations are produced by one of punching or with the aid of laser radiation, and wherein the solar cells to be connected are pseudosquare solar cells, and wherein additional recesses are introduced in areas of bevels of the pseudosquare solar cells.

3. The method as recited in claim 1, wherein the comb structures have a surface shape which is adapted to contact configurations and expected current intensity conditions of the solar module.

4. The method as recited in claim 1, wherein the carrier film sheet is provided with an adhesive layer.

5. The method as recited in claim 1, wherein prior to applying the cover film, an adhesive layer is provided on the cover film.

6. The method as recited in claim 5, further comprising:
   rolling the foil-like electrical connector into a roll for subsequent processing;
   wherein, prior to winding the foil-like electrical connector into a roll, the adhesives are cured, and exposed conductive surfaces are wetted with at least one of a fluxing agent and a solder.

7. The method as recited in claim 6, wherein the wetting is carried out with the aid of a flow soldering bath.

8. The method as recited in claim 1, wherein separating points are formed in the foil-like electrical connector after a predefined length of the foil-like electrical connector corresponding to a predefined number of the solar cells, and wherein wider conductive transverse sheets are provided in the section of the foil-like electrical connector containing the separating points.

9. The method as recited in claim 1, wherein the conductive foil sheet is made of copper and has recesses located in the area of the soldering points, and wherein the dimensions of the recesses in the conductive foil sheet are smaller than the dimensions of the recesses in the carrier film sheet.

10. The method as recited in claim 9, wherein the cover film includes recesses in the area of the soldering points, and wherein the dimensions of the recesses in the cover film are larger than the dimensions of the recesses in the conductive foil sheet.

11. The method as recited in claim 1, wherein the carrier film sheet and the cover film are provided with an adhesive layer which is at least one of pressure-activatable and heat-activatable, and wherein the step of folding and fixing of the lateral overhangs of the cover film is carried out in the same furnace chamber in which the lamination of the cover film to the composite sheet is performed.

12. The method as recited in claim 1, wherein prior to positioning the conductive foil sheet on the carrier film sheet, the carrier film sheet is wetted with an adhesive, and wherein the conductive foil sheet and the carrier film sheet are subsequently laminated together under pressure.

13. The method as recited in claim 1, wherein prior to folding, the cover film edges are cut from the outside toward the middle of the composite sheet.

14. A method for electrically connecting at least two solar cells to form a solar module, comprising:
   providing a foil-like electrical connector for connecting solar cells, wherein the foil-like electrical connector is prepared by a process including:
      providing an insulating carrier film sheet having a width which essentially corresponds to the width of the solar cells to be connected;
      subsequently introducing into the carrier film sheet (i) recesses in an area corresponding to future soldering points, and (ii) adjustment and transport perforations into side strip edge areas;
      providing a conductive foil sheet having a width corresponding to the carrier film sheet, wherein (i) adjustment and transport perforations are introduced into the conductive foil sheet at side strip edge areas, (ii) comb structures configured to function as electrical connection fingers are provided in the conductive foil sheet, and (iii) retaining webs are provided in a direction of the adjustment and transport perforation to ensure secure positioning of the comb structures;
      positioning the conductive foil sheet on the carrier film sheet with the aid of pin-shaped extensions of one of a transport belt or a transport roller, the extensions engaging in the corresponding adjustment and transport perforations of the conductive foil sheet and the insulating carrier film sheet;
      joining the carrier film sheet to the conductive foil sheet via an adhesive bond to form composite sheet;
      separating the side edge strips and severing the retaining webs;
      laminating an insulating cover film at each side edge of the composite sheet, the cover film having lateral overhangs in relation to the side edges of the composite sheet;
      folding the lateral overhangs of the cover film and fixing the folded lateral overhangs to the bottom side of the composite sheet to form the foil-like electrical connector, wherein the folded lateral overhangs insulate the edges of the composite sheet; and
      rolling the foil-like electrical connector into a roll;
   unwinding the roll and connecting a predetermined number of solar cells to the unwound section of the foil-like electrical connector to form a string, wherein the connecting includes soldering at soldering points of the solar cells to contact points of the foil-like electrical connector which are exposed through punched holes in the carrier film sheet;
   positioning the produced string on a transparent sheet provided with an encapsulation material, wherein the position of the produced string is rotated by 180° relative to a preceding string; and
   providing a series connection of multiple strings via transverse connectors.

15. The method as recited in claim 14, wherein the predetermined number of solar cells are aligned with the structures of the foil-like electrical connector in that solder passage openings of the foil-like electrical connector and solder reservoirs are placed congruently on the solar cells, and wherein the solar cells are visible through the solder passage openings.

\* \* \* \* \*